(12) United States Patent
Zhou et al.

(10) Patent No.: US 6,985,019 B1
(45) Date of Patent: Jan. 10, 2006

(54) OVERVOLTAGE CLAMP CIRCUIT

(75) Inventors: Shi-dong Zhou, Milpitas, CA (US); Ping Zhang, Sunnyvale, CA (US); Ronald L. Cline, Albuquerque, NM (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 10/823,450

(22) Filed: Apr. 13, 2004

(51) Int. Cl.
*H03K 5/08* (2006.01)

(52) U.S. Cl. .................................... 327/309
(58) Field of Classification Search ............... 327/306, 327/309–310, 317–319, 321–322, 328, 333; 326/30, 56–57, 62–63, 68; 361/90, 91.1
See application file for complete search history.

(56) References Cited

U.S. PATENT DOCUMENTS 6,031,408 A * 2/2000 Flannagan ............... 327/349
6,057,717 A * 5/2000 Kawano et al. ............. 327/112
6,078,487 A * 6/2000 Partovi et al. .............. 361/156
6,865,116 B2 * 3/2005 Kim et al. ............. 365/189.08
6,897,703 B2 * 5/2005 Hunt ......................... 327/313

* cited by examiner

*Primary Examiner*—My-Trang Nu Ton
(74) *Attorney, Agent, or Firm*—William L. Paradice, II; Justin Liu

(57) ABSTRACT

A selectively enabled clamp circuit for limiting voltage overshoot on an input/output (I/O) pin of an associated integrated circuit (IC) device includes a single discharge transistor and a select circuit. The single discharge transistor is connected between the I/O pin and ground potential, and the select circuit is coupled to the I/O pin and includes an input to receive an enable signal and an output coupled to a gate of the signal discharge transistor. For some embodiments, the select circuit includes a level shifter circuit and a voltage detection circuit.

21 Claims, 5 Drawing Sheets

OVERVOLTAGE CLAMP CIRCUIT

FIELD OF INVENTION

The present invention relates generally to integrated circuits, and more specifically to voltage clamp circuits.

DESCRIPTION OF RELATED ART

For many integrated circuit (IC) devices, the input/output (I/O) pins are coupled to overvoltage clamp circuits that prevent the input voltage level at the I/O pins from exceeding the IC devices' internal voltage supply by a predetermined amount to prevent damage to the IC devices' internal circuitry. For example, because output signals from Peripheral Component Interconnect (PCI) devices using a 3.3 volt supply may have voltage overshoots exceeding 7 volts for up to one second, it is necessary to clamp the voltage of these signals at the I/O pin(s) of a connected device to prevent damage to the connected device's internal circuitry. However, some non-PCI devices operate according to other standards (e.g., the well-known LVCMOS standards) that require the I/O pins of connected devices to be tri-statable. Unfortunately, connecting an overvoltage clamp circuit to an I/O pin of a device may prevent the I/O pin from being properly tri-stated. As a result, some IC devices include an overvoltage clamp circuit that can be selectively enabled and disabled, thereby allowing such devices to operate in either PCI systems that require input signals to be clamped or in non-PCI systems that require the I/O pins to be tri-statable.

FIG. 1 shows an IC device 100 having internal logic 102, an I/O pin 103, a buffer 104, and a conventional overvoltage clamp circuit 110. Buffer 104, which includes a first terminal coupled to internal logic 102 via signal line 105a and includes a second terminal coupled to I/O pin 103 via a signal line 105b, buffers signals between I/O pin 103 and internal logic 102. Typically, buffer 104 includes one or more well-known CMOS inverters (only one shown in FIG. 1 for simplicity), although other buffers can be used. Clamp circuit 110, which can be selectively enabled and disabled in response to an enable signal EN, includes resistors R1–R3, a PMOS transistor 111, and NMOS transistors 112 and 113. PMOS transistor 111, resistor R3, and NMOS transistor 112 are connected in series between signal line 105b and ground potential. Resistors R1–R2 form a voltage divider that provides a ratioed voltage to the gate of PMOS transistor 111 via node A. The ratioed voltage at node A is a predetermined fraction of VDD that is determined by the relative resistances of R1 and R2. The gate of NMOS transistor 112 receives the enable signal EN. NMOS transistor 113 is connected between signal line 105b and a node C between resistor R3 and NMOS transistor 112, and has a gate coupled to a node B between resistor R3 and PMOS transistor 111. Together, NMOS transistors 112–113 form a discharge path that sinks current from signal line 105b when the voltage level on signal line 105b exceeds a predetermined voltage, for example, during voltage overshoot of input signals applied to I/O pin 103.

To enable clamp circuit 110, EN is asserted to a logic high state (e.g., to VDD) to turn on NMOS transistor 112. Node B is at or near ground potential, which maintains NMOS transistor 113 in a non-conductive state. The voltage divider formed by resistors R1–R2 provides a ratioed voltage to the gate of PMOS transistor 111 that maintains transistor 111 in a non-conductive state as long as the voltage on signal line 105b remains below a predetermined level. If overshoots in an input signal applied to I/O pin 103 cause the voltage on signal line 105b to exceed the gate voltage of transistor 111 by more than the threshold voltage (Vtp) of transistor 111, then transistor 111 turns on and quickly pulls node B toward the signal line voltage via resistor R3 and transistor 112. As the rising voltage at node B exceeds the threshold voltage (Vtn) of transistor 113, transistor 113 turns on and sinks current from signal line 105b to ground potential through transistors 112 and 113, thereby quickly discharging the voltage on I/O pin 103 to a lower (e.g., safer) level. When the signal line voltage is discharged below the predetermined level (e.g., approximately less than one Vtp above VDD), transistor 111 turns off and node B quickly discharges toward ground potential through resistor R3 and transistor 112, thereby turning off transistor 113 to stop discharging signal line 105b.

To disable clamp circuit 110, EN is de-asserted to a logic low state (e.g., to ground potential) to maintain NMOS transistor 112 in a non-conductive state, thereby disabling clamp circuit 110 by preventing signal line 105b from being discharged through transistor 112. When clamp circuit 110 is disabled, I/O pin 103 can be tri-stated, which as described above may be desirable for device 100 to operate in some non-PCI systems that require I/O pins to be tri-stated.

Although allowing clamp circuit 110 to be selectively enabled and disabled in response to EN, the inclusion of NMOS transistor 112 in the discharge path with NMOS transistor 113 significantly increases the series resistance of the discharge path from signal line 105b to ground potential. As a result, NMOS transistors 112 and 113 are typically very large transistors that can quickly discharge signal line 105b during voltage overshoot conditions on signal line 105b. For some devices that utilize clamp circuit 110, the width of transistors 112 and 113 can be several orders of magnitude greater than that of other transistors in the device, e.g., transistor 111 and the transistors (not shown for simplicity) within internal logic 102, which can undesirably increase circuit size.

Thus, there is a need for an overvoltage clamp circuit that can be selectively enabled and disabled and which occupies less silicon area than that of prior art clamp circuit 110.

An area-efficient clamp circuit is disclosed that can be selectively enabled and disabled. In accordance with the present invention, a selectively enabled clamp circuit for limiting voltage overshoot on an input/output (I/O) pin of an associated integrated circuit (IC) device includes a single discharge transistor and a select circuit. The single discharge transistor is connected between the I/O pin and ground potential, and the select circuit is coupled to the I/O pin and includes an input to receive an enable signal and an output coupled to a gate of the discharge transistor. If the enable signal is in an asserted state, the select circuit turns on the discharge transistor when the voltage on the I/O pin exceeds a predetermined voltage level. If the enable signal is in a de-asserted state, the select circuit maintains the discharge transistor in a non-conductive state that allows the I/O pin to be tri-stated.

For some embodiments, the select circuit includes a level shifter circuit and a voltage detection circuit. For one embodiment, the level shifter circuit has a power terminal coupled to the I/O pin and includes an input to receive the enable signal, and the voltage detection circuit is coupled to the I/O pin and includes an input coupled to an output of the level shifter circuit and an output coupled to the gate of the discharge transistor. For another embodiment, the voltage detection circuit includes a detection transistor connected between the I/O pin and a first node and has a gate coupled to a voltage supply of the IC device, and the level shifter circuit has a power terminal coupled to the first node and includes an input to receive the enable signal and an output coupled to the gate of the discharge transistor.

For some embodiments, the enable signal is asserted if the IC device is operating in a PCI system and is de-asserted if the IC device is operating in a system that requires the I/O pin to be tri-statable (e.g., an LVCMOS system).

BRIEF DESCRIPTION OF THE DRAWINGS

The features and advantages of the present invention are illustrated by way of example and are by no means intended to limit the scope of the present invention to the particular embodiments shown, and in which.

Like reference numerals refer to corresponding parts throughout the drawing figures.

DETAILED DESCRIPTION

The present invention is applicable to a variety of integrated circuits and systems, and is particularly useful for devices that may operate both in systems that require the device I/O pins to be clamped to a predetermined voltage level (e.g., in PCI environments) and in systems that require the device I/O pins to be tri-statable (e.g., in LVCMOS environments). In the following description, for purposes of explanation, specific nomenclature is set forth to provide a thorough understanding of the present invention. In other instances, well-known circuits and devices are shown in block diagram form to avoid obscuring the present invention. Further, the logic levels assigned to various signals in the description below are arbitrary, and thus can be modified (e.g., reversed polarity) as desired. Accordingly, the present invention is not to be construed as limited to specific examples described herein but rather includes within its scope all embodiments defined by the appended claims.

Figure 1:
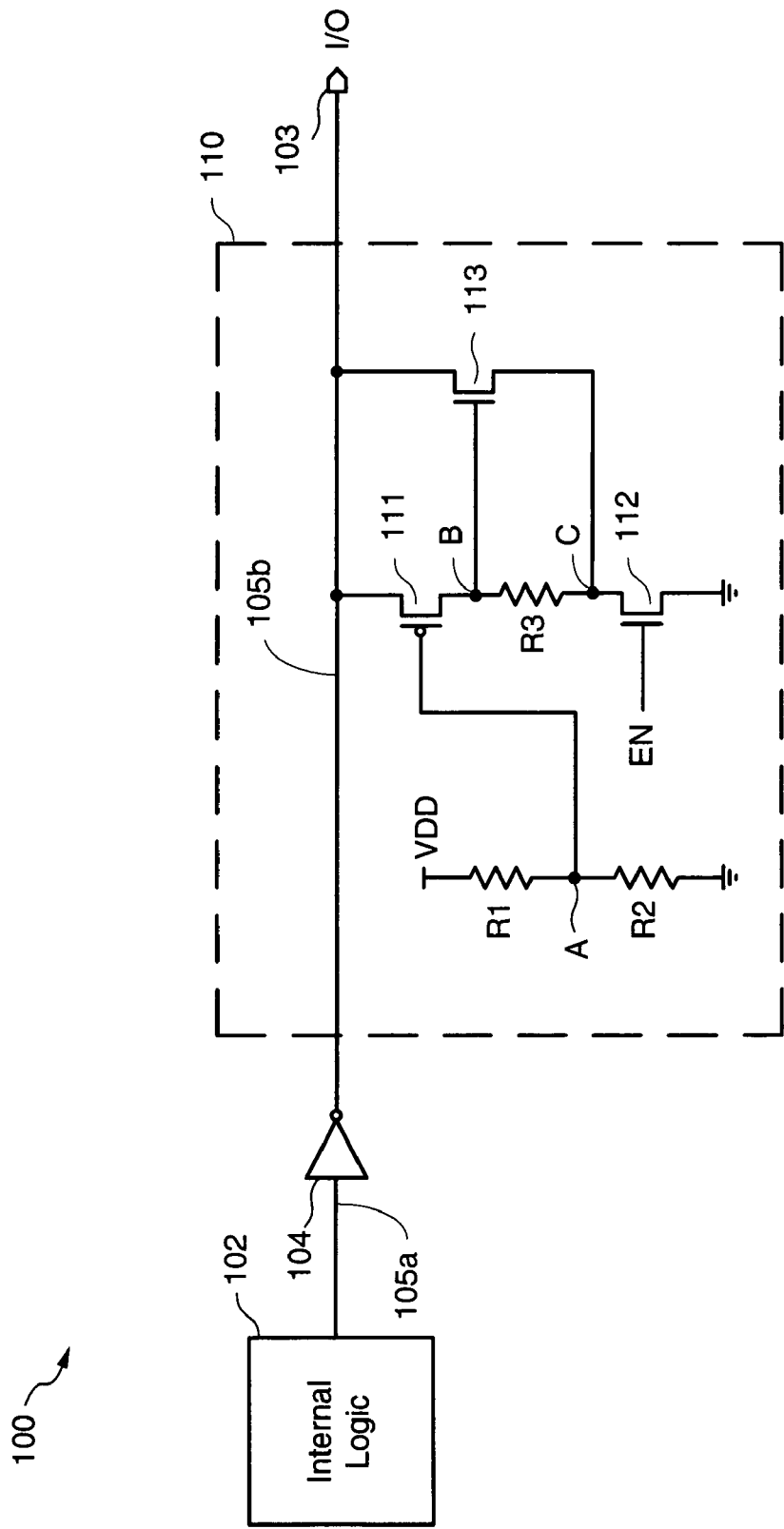
FIG. 1 is a circuit diagram of a conventional overvoltage clamp circuit.
Figure 2:
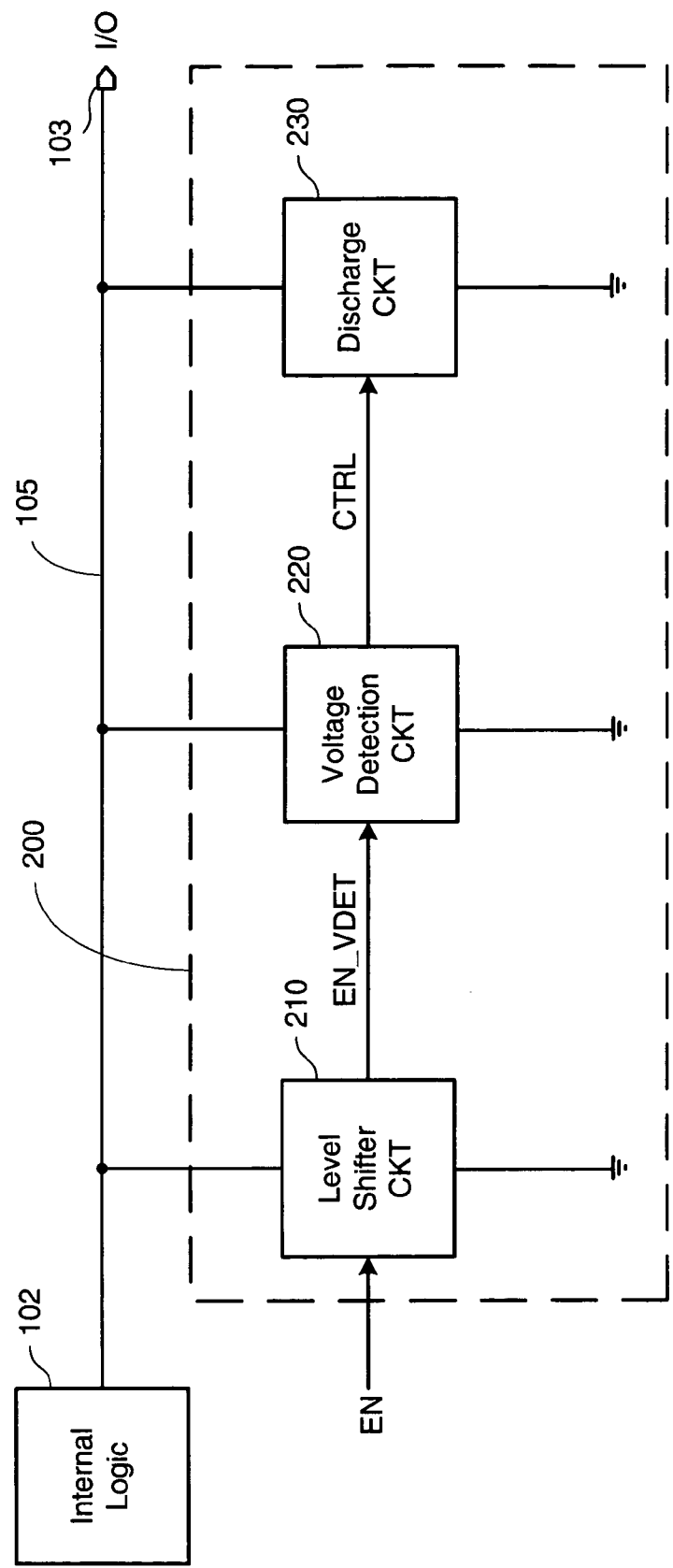
FIG. 2 is a block diagram of an overvoltage clamp circuit in accordance with one embodiment of the present invention.

FIG. 2 shows a block diagram of an overvoltage clamp circuit 200 in accordance with one embodiment of the present invention. Clamp circuit 200 is coupled to signal line 105, which is connected between I/O pin 103 and internal logic 102 of an associated IC device (not shown for simplicity). The associated IC device can be any well-known device, and internal logic 102 can include any suitable logic or circuitry. For some embodiments, the associated device can be a programmable logic device (PLD), and internal logic 102 can include configurable logic blocks (CLBs), I/O blocks (IOBs), memory elements, processors, and/or other well-known PLD components. Further, although not shown in the exemplary embodiment of FIG. 2 for simplicity, actual embodiments may include a buffer (e.g., buffer 104 of FIG. 1) connected between internal logic 102 and I/O pin 103.

Clamp circuit 200 includes a level shifter circuit 210, a voltage detection circuit 220, and a discharge circuit 230. Level shifter circuit 210 includes power terminals coupled to signal line 105 and to ground potential, an input terminal to receive an enable signal EN, and an output terminal to generate a voltage detection enable signal EN_VDET. Level shifter circuit 210 drives EN_VDET to a first logic state that enables voltage detection circuit 220 in response to an asserted EN, and drives EN_VDET to a second logic state that disables voltage detection circuit 220 in response to a de-asserted EN. For some embodiments, level shifter 210 may be any suitable, well-known voltage level shifter circuit.

Voltage detection circuit 220 is coupled between signal line 105 and ground potential, and includes an input terminal to receive EN_VDET and an output terminal to generate a discharge control signal CTRL. If enabled, voltage detection circuit 220 monitors the voltage level on signal line 105 and, when the signal line voltage exceeds a predetermined level, drives CTRL to an asserted state. Otherwise, if the signal line voltage does not exceed the predetermined level, or if disabled by EN_VDET, voltage detection circuit 220 maintains CTRL in a de-asserted state. For some embodiments, voltage detection circuit 220 may be any well-known circuit that asserts CTRL when the voltage on signal line 105 exceeds the predetermined voltage level.

Discharge circuit 230 selectively provides a discharge path between signal line 105 and ground potential in response to CTRL. When CTRL is asserted, discharge circuit 230 sinks current from signal line 105 to discharge signal line 105, for example, during voltage overshoot of an input signal applied to I/O pin 103. When CTRL is de-asserted, discharge circuit 230 isolates signal line 105 from ground potential and does not discharge signal line 105.

For some embodiments, level shifter circuit 210 and voltage detection circuit 220 form a select circuit that selectively enables discharge circuit 230 to discharge signal line 105 in response to EN. Thus, the select circuit formed by level shifter circuit 210 and voltage detection circuit 220 may be any suitable circuit that (1) enables discharge circuit 230 to sink current from signal line 105 when EN is asserted and when the signal line voltage exceeds the predetermined level and (2) disables discharge circuit 230 to prevent the signal line voltage from being clamped when EN is de-asserted.

As discussed in more detail below, discharge circuit 230 may include only one transistor coupled between signal line 105 and ground potential, and therefore can be half the size of discharge transistors 112 and 113 of clamp circuit 110 of FIG. 1 without decreasing the rate at which signal line 105 is discharged. Accordingly, embodiments of the present invention provide a clamp circuit that can be selectively enabled and disabled and which occupies less silicon area than prior art clamp circuit 110 without any loss of current-sinking performance.

Figure 3:
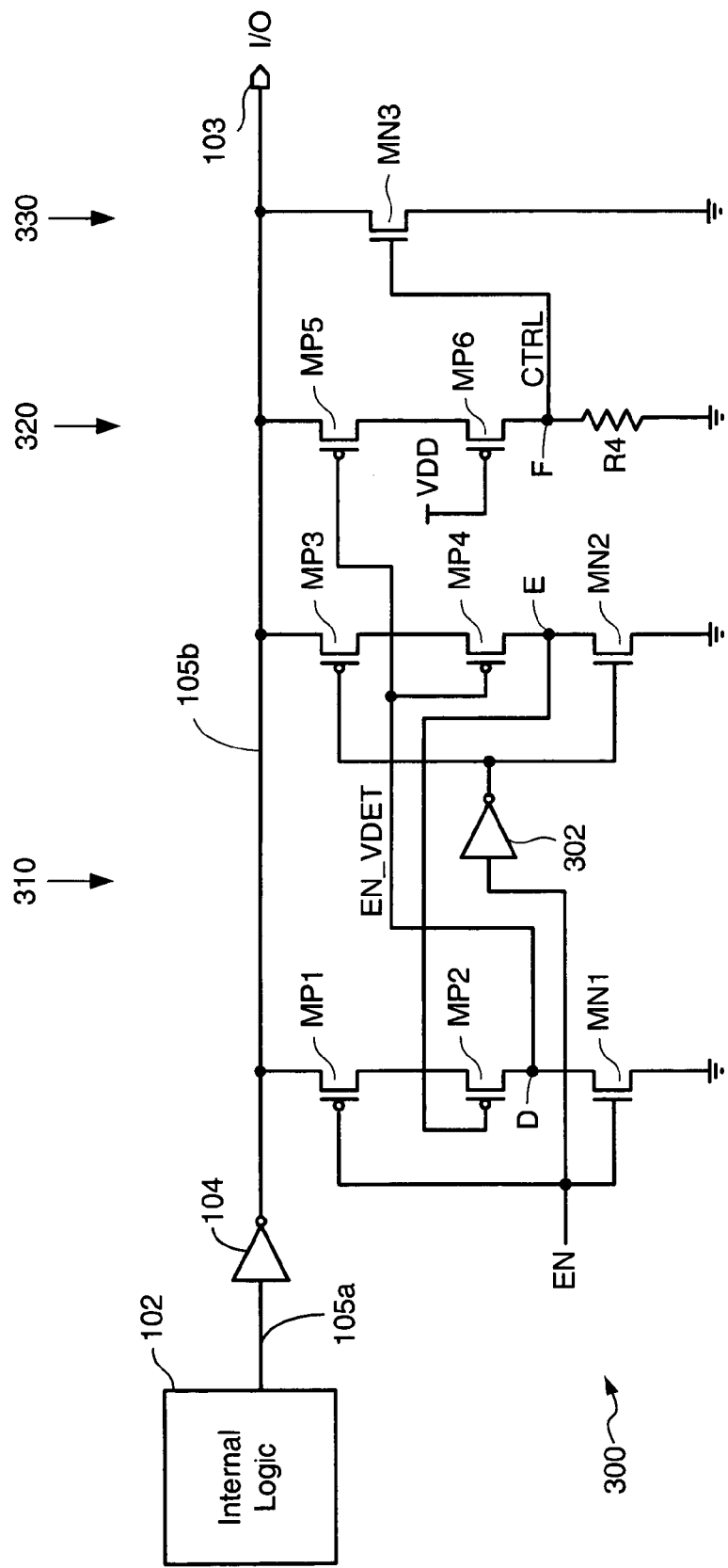
FIG. 3 is a circuit diagram of an overvoltage clamp circuit that is one embodiment of the clamp circuit of FIG. 2.

FIG. 3 shows a clamp circuit 300 that is one embodiment of clamp circuit 200 of FIG. 2. Clamp circuit 300 includes a level shifter circuit 310, a voltage detection circuit 320, and a discharge circuit 330. Level shifter circuit 310, which is one embodiment of level shifter circuit 210 of FIG. 2, includes PMOS transistors MP1–MP4, NMOS transistors MN1–MN2, and an inverter 302. Transistors MP1, MP2, and MN1 are connected in series between signal line 105*b* and ground potential, with the gates of MP1 and MN1 receiving the enable signal EN. Transistors MP3, MP4, and MN2 are connected in series between signal line 105*b* and ground potential, with the gates of MP3 and MN2 coupled to an output of inverter 302. Inverter 302, which may be any suitable logical inversion circuit such as a well-known CMOS inverter, includes an input to receive EN. The gate of MP2 is coupled to a node E between MP4 and MN2, and the gate of MP4 is coupled to a node D between MP2 and MN1. Node D provides the voltage detection enable signal EN_VDET to voltage detection circuit 320. For other embodiments, other voltage level shifter circuits may be used.

Voltage detection circuit 320, which is one embodiment of voltage detection circuit 220 of FIG. 2, includes PMOS transistors MP5–MP6 and a resistor R4 connected in series between signal line 105b and ground potential. The gate of MP5 is coupled to node D of level shifter circuit 310 (i.e., the EN_VDET signal), and the gate of MP6 is coupled to VDD. For other embodiments, other voltage detection circuits may be used.

Discharge circuit 330, which is one embodiment of discharge circuit 230 of FIG. 2, includes an NMOS transistor MN3 connected in series between signal line 105b and ground potential, with the gate of MN3 coupled to a node F between MP6 and R4. Node F provides the discharge control signal CTRL to discharge circuit 330.

To enable clamp circuit 300, EN is asserted to logic high, which turns off MP1 and turns on MN1. The logic high state of EN is inverted by inverter 302 to generate a logic low signal that turns on MP3 and turns off MN2. The conductive state of MN1 pulls node D low toward ground potential (e.g., to a logic low state), which turns on MP4 and MP5. The non-conductive state of MP1 isolates node D from signal line 105b, and the non-conductive state of MN2 isolates node E from ground potential.

If the voltage on signal line 105b exceeds VDD by the threshold voltage (Vtp) of MP6 (e.g., if V(105b)>VDD+Vtp (MP6)), MP6 turns on and quickly charges node F toward the signal line voltage via MP5. As the voltage at node F rises above the threshold voltage (Vtn) of MN3 (e.g., as CTRL transitions to an asserted logic high state), MN3 turns on and sinks current from signal line 105b to quickly discharge signal line 105b towards ground potential. When the voltage on signal line 105b drops below VDD+Vtp (MP6), MP6 turns off and node F quickly discharges toward ground potential through resistor R4 (i.e., CTRL transitions to a de-asserted logic low state), thereby turning off transistor MN3 to stop discharging signal line 105b.

To disable clamp circuit 300, EN is de-asserted to logic low, which turns off MN1 and turns on MP1. The logic low state of EN is inverted by inverter 302 to generate a logic high signal that turns on MN2 and turns off MP3. The conductive state of MN2 discharges node E toward ground potential, which turns on MP2. Thus, with both MP1 and MP2 conductive, node D is charged toward the signal line voltage (e.g., to a logic high state), which turns off MP4 and MP5. The non-conductive states of MP3 and MP4 isolate node E from signal line 105b, and the non-conductive state of MP5 isolates node F from the signal line voltage. As a result, node F is maintained at or near ground potential (e.g., in a de-asserted logic low state) via R4. The resulting logic low state of node F (e.g., CTRL) maintains MN3 in a non-conductive state, thereby preventing discharge circuit 330 from sinking current from signal line 105b.

Note that because level shifter circuit 310 has one of its power terminals connected to signal line 105b, level shifter circuit 310 maintains node D at the same voltage level as signal line 105b when clamp circuit 300 is disabled. This is important for applications in which the logic high voltage level of input signals applied to I/O pin 103 are greater than VDD. Otherwise, if the positive power terminal of level shifter circuit 310 is connected to VDD and the logic high voltage level of input signals applied to pin 103 is greater than VDD, voltage level shifter 310 may inadvertently cause discharge circuit 330 to clamp the voltage on signal line 105b even if EN is de-asserted.

As described above, the discharge circuit 330 of clamp circuit 300 includes only one transistor MN3 that is selectively enabled and disabled in response to EN. The inclusion of only a single transistor MN3 in the discharge path between signal line 105b and ground potential allows transistor MN3 of clamp circuit 300 to be approximately one-half the size of discharge transistors 112 and 113 of prior art clamp circuit 110, which in turn may result in a significant reduction in circuit size without diminishing the speed with which signal line 105b is discharged during input signal overshoot conditions. In addition, the ability to selectively enable and disable discharge transistor MN3 makes clamp circuit 300 ideal for use in IC devices that may be used in systems that require the device I/O pins to be clamped to a predetermined voltage level (e.g., in PCI environments) or in systems that require the device I/O pins to be tri-statable (e.g., in LVCMOS environments).

The resistance of R4 and the relative sizes of MP5 and MP6 may be manipulated to adjust how quickly rising voltages on signal line 105b trigger the turning on of discharge transistor MN3 and how quickly falling voltages on signal line 105b turn off discharge transistor MN3. Further, the Vtp of MP6 can be manipulated during fabrication using well-known techniques (e.g., by adjusting the dopant concentrations of various active regions thereof) to adjust the predetermined voltage at which signal line 105b is clamped by clamp circuit 300.

Figure 4:
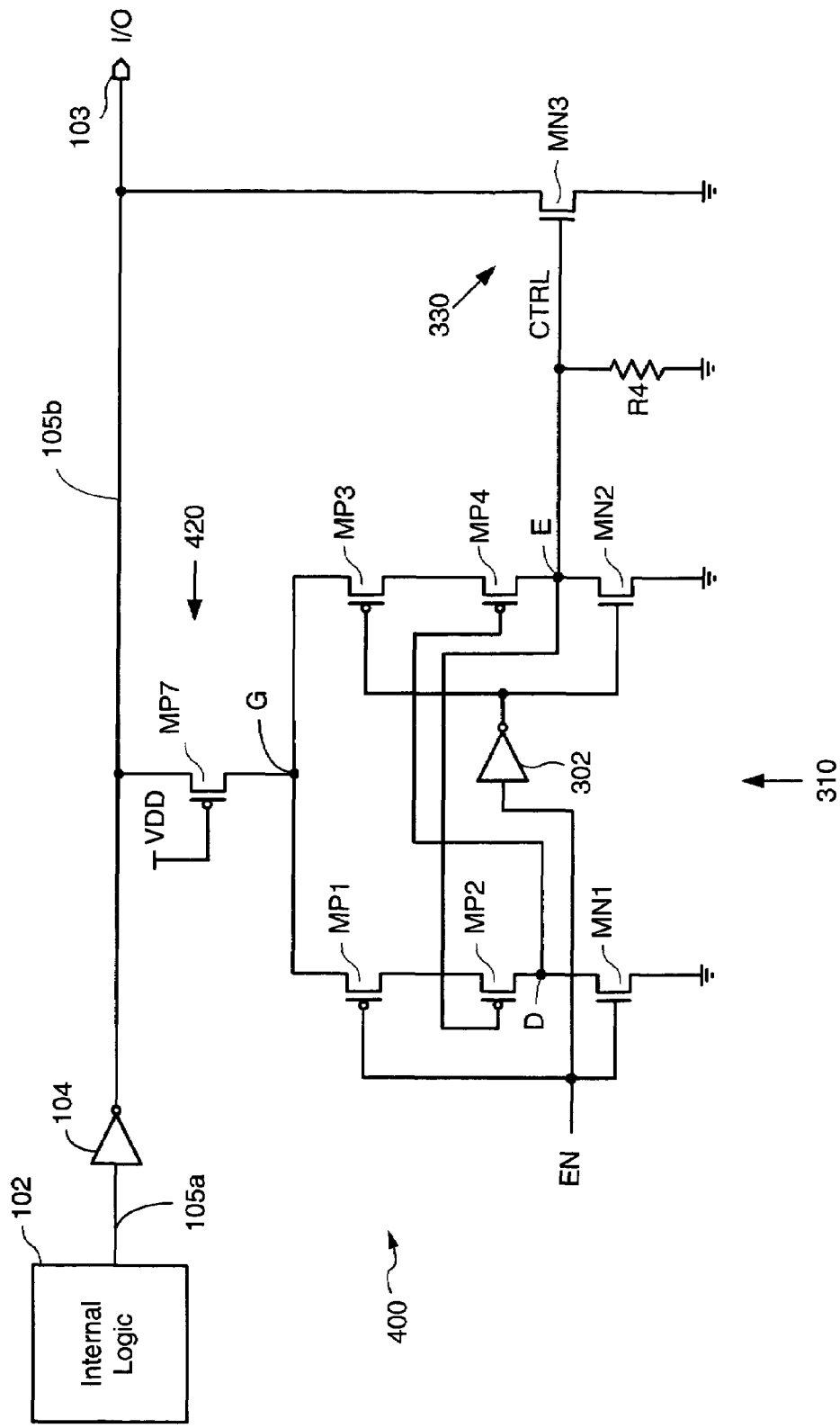
FIG. 4 is a circuit diagram of an overvoltage clamp circuit that is another embodiment of the clamp circuit of FIG. 2.

FIG. 4 shows a clamp circuit 400 that is another embodiment of clamp circuit 200 of FIG. 2. Clamp circuit 400 includes the level shifter circuit 310 and discharge circuit 330 of FIG. 3, as well as a voltage detection circuit 420. For the embodiment of FIG. 4, voltage detection circuit 420 includes a PMOS transistor MP7 coupled between signal line 105b and a node G. Level shifter circuit 310 has a first power terminal coupled to node G and a second power terminal coupled to ground potential, and includes an input to receive EN and an output to generate the discharge control signal CTRL at node E. Thus, in contrast to the embodiment of FIG. 3, the output of level shifter circuit 310 of clamp circuit 400 directly controls the enabling and disabling of discharge circuit 330 via CTRL at node E, and the positive power terminal of level shifter circuit 310 is coupled to voltage detection circuit 420 at node G. NMOS transistor MN3, which forms discharge circuit 330 of FIG. 4, is connected between signal line 105b and ground potential and has a gate to receive CTRL.

To enable clamp circuit 400, EN is asserted to logic high which, as described above with respect to FIG. 3, turns on MP3 and MN1 and turns off MP1 and MN2. The non-conductive states of MN2 and MP1 isolate node E from ground potential and isolate signal line 105b from node D, respectively. The conductive state of MN1 pulls node D low toward ground potential, which turns on MP4, and the conductive state of MP3 couples node E to node G.

If the voltage on signal line 105b exceeds VDD by the threshold voltage (Vtp) of MP7 (e.g., if V(105b)>VDD+Vtp (MP7)), MP7 turns on and quickly charges node E toward the signal line voltage via MP3 and MP4. As the voltage at node E rises above the threshold voltage (Vtn) of MN3, MN3 turns on and sinks current from signal line 105b to quickly discharge signal line 105b towards ground potential. When the voltage on signal line 105b drops below VDD+Vtp(MP7), MP7 turns off and node E quickly discharges toward ground potential through resistor R4, thereby turning off transistor MN3 to stop discharging signal line 105b.

To disable clamp circuit 400, EN is de-asserted to logic low, which turns off MN1 and MP3 and turns on MP1 and MN2. The conductive state of MN2 discharges node E toward ground potential, which maintains MN3 in a non-conductive state and thereby prevents MN3 from sinking current from signal line 105b. The logic low level at node E turns on MP2, thereby charging node D toward the signal line voltage via MP1 and MP2. The resulting logic high state of node D turns off MP4, which isolates node E from signal line 105b.

The resistance of R4 and the relative size of MP7 may be manipulated to adjust how quickly rising voltages on signal line 105b trigger the turning on of discharge transistor MN3 and how quickly falling voltages on signal line 105b turn off discharge transistor MN3. Further, the Vtp of MP7 can be manipulated during fabrication using well-known techniques (e.g., by adjusting the dopant concentrations of various active regions thereof) to adjust the predetermined voltage at which signal line 105b is clamped by clamp circuit 400.

Figure 5:
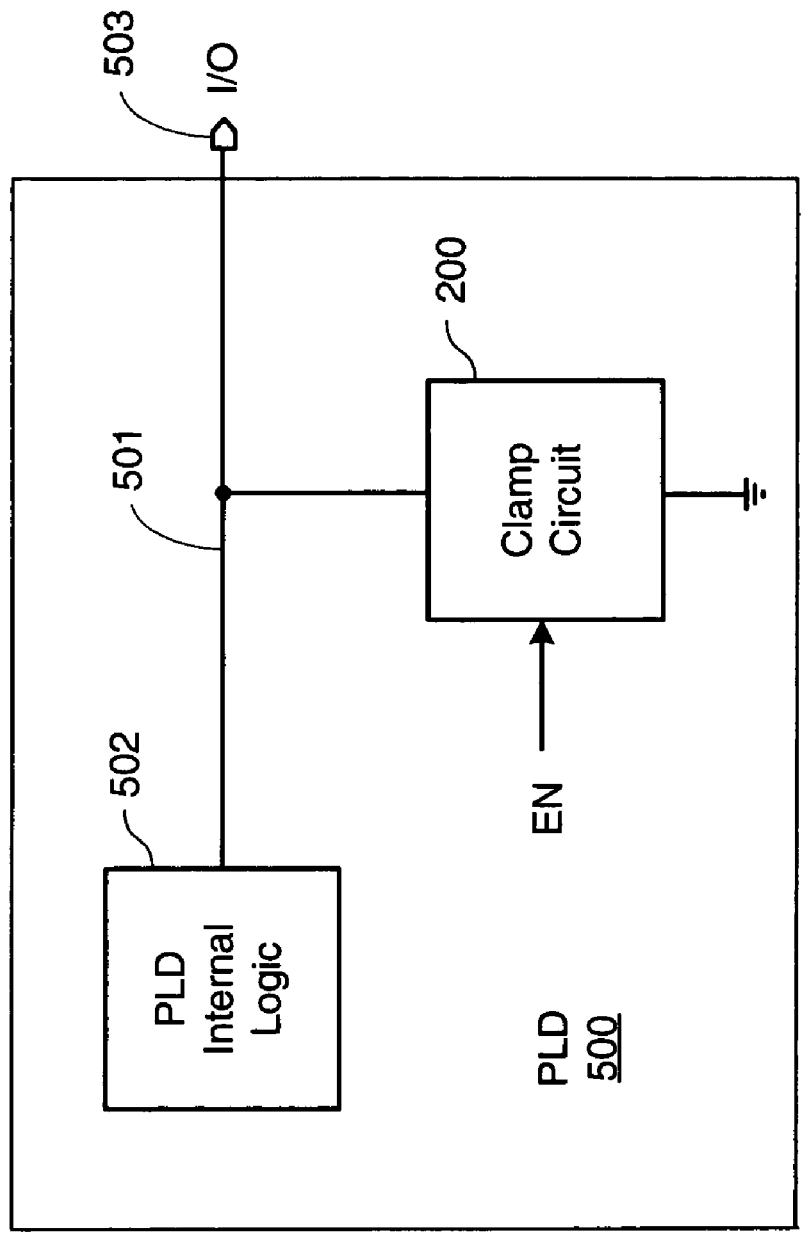
FIG. 5 is a block diagram illustrating the overvoltage clamp circuit of FIG. 2 as part of a programmable logic device.

FIG. 5 shows a PLD device 500 having clamp circuit 200 connected to a signal line 501 coupled between the PLD's internal logic 502 and the PLD's I/O pin 503. For simplicity, only one I/O pin and clamp circuit 200 are shown in FIG. 5. Clamp circuit 200 can be selectively enabled or disabled in response to EN, as described above. PLD device 500 may be any suitable PLD, including field programmable gate arrays (FPGAs) and complex PLDS (CPLDs). PLD logic 502 may include any suitable logic circuits or components such as, for example, CLBs, IOBs, programmable interconnect structures, volatile and non-volatile semiconductor memory elements, microprocessors, and other well-known PLD components.

For the embodiments described above, the enable signal EN can be generated in any suitable manner using any suitable circuit. For some embodiments, EN may be generated within the IC device, for example, in response to a determination of whether the device is operating in a PCI environment. For other embodiments, EN can be an externally generated signal (e.g., a user-generated signal) that may be provided to the device via a suitable I/O pin.

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A selectively enabled clamp circuit for limiting voltage overshoot on an input/output (I/O) pin of an associated integrated circuit (IC) device, comprising:
   a single transistor connected between the I/O pin and around potential and having a gate; and
   means for controlling the conductive state of the single transistor in response to an enable signal;
   wherein the means for controlling comprises:
   a voltage detection circuit coupled to the I/O pin, the voltage detection circuit having an output terminal coupled to the gate of the single transistor and having an input terminal; and
   a voltage level shifter circuit having a power terminal connected to the I/O pin, an output terminal coupled to the input terminal of the voltage detection circuit, and an input terminal to receive the enable signal.

2. The clamp circuit of claim 1, wherein the enable signal is asserted when the IC device operates in a first system that requires the I/O pin to be clamped during a voltage overshoot condition and the enable signal is de-asserted when the IC device operates in a second system that requires the I/O pin to be tri-stated.

3. The clamp circuit of claim 1, wherein the voltage detection circuit comprises:
   first and second PMOS transistors connected in series between the I/O pin and the output terminal of the voltage detection circuit, the first PMOS transistor having a gate coupled to the output terminal of the level shifter circuit, and the second PMOS transistor having a gate coupled to a voltage supply of the IC device; and
   a resistor connected between the output terminal of the voltage detection circuit and ground potential.

4. The clamp circuit of claim 3, wherein the voltage detection circuit turns on the single transistor when voltage on the I/O pin is greater than a sum of a threshold voltage of the second PMOS transistor and the voltage supply of the IC device if the enable signal is asserted.

5. The clamp circuit of claim 4, wherein the level shifter circuit turns on the first PMOS transistor when the enable signal is asserted and turns off the first PMOS transistor when the enable signal is de-asserted.

6. A selectively enabled clamp circuit for limiting voltage overshoot on an input/output (I/O) pin of an associated integrated circuit (IC) device, comprising:
   a single transistor connected between the I/O pin and around potential and having a gate; and
   means for controlling the conductive state of the single transistor in response to an enable signal;
   wherein the means for controlling comprises:
   a PMOS transistor connected between the I/O pin and an intermediate node and having a gate coupled to a voltage supply of the IC device; and
   a voltage level shifter circuit having a power terminal connected to the intermediate node, an output terminal coupled to the gate of the single transistor, and an input terminal to receive the enable signal.

7. The clamp circuit of claim 6, further comprising:
   a resistor connected between the gate of the single transistor and ground potential.

8. The clamp circuit of claim 6, wherein the level shifter circuit turns on the single transistor when voltage on the I/O pin is greater than a sum of a threshold voltage of the PMOS transistor and the voltage supply of the IC device if the enable signal is asserted.

9. The clamp circuit of claim 8, wherein the level shifter circuit maintains the single transistor in a non-conductive state if the enable signal is de-asserted.

10. The clamp circuit of claim 6, wherein the enable signal is asserted when the IC device operates in a first system that requires the I/O pin to be clamped during a voltage overshoot condition and the enable signal is de-asserted when the IC device operates in a second system that requires the I/O pin to be tri-stated.

11. A selectively enabled clamp circuit for limiting voltage overshoot on an input/output (I/O) pin of an associated integrated circuit (IC) device, comprising:
   a discharge circuit connected between the I/O pin and ground potential;

a voltage detection circuit coupled to the I/O pin, the voltage detection circuit having an output terminal coupled to the discharge circuit and having an input terminal; and a voltage level shifter circuit having a power terminal connected to the I/O pin, an output terminal coupled to the input terminal of the voltage detection circuit, and an input terminal to receive an enable signal.

12. The claim circuit of claim 11, wherein the discharge circuit comprises a single NMOS transistor connected between the I/O pin and ground potential and having a gate; and wherein the output terminal of the voltage detection circuit is coupled to the gate of the single transistor.

13. The clamp circuit of claim 12, wherein the voltage detection circuit comprises:

first and second PMOS transistors connected in series between the I/O pin and the output terminal of the voltage detection circuit, the first PMOS transistor having a gate coupled to the output terminal of the level shifter circuit, and the second PMOS transistor having a gate coupled to a voltage supply of the IC device; and a resistor connected between the output terminal of the voltage detection circuit and ground potential.

14. The clamp circuit of claim 13, wherein the voltage level shifter circuit turns on the NMOS transistor when voltage on the I/O pin is greater than a sum of a threshold voltage of the second PMOS transistor and the voltage supply of the IC device if the enable signal is asserted.

15. The clamp circuit of claim 13, wherein the voltage level shifter circuit maintains the NMOS transistor in a non-conductive state when the enable signal is de-asserted.

16. The clamp circuit of claim 13, wherein the level shifter circuit turns on the first PMOS transistor when the enable signal is asserted and turns off the first PMOS transistor when the enable signal is de-asserted.

17. A selectively enabled clamp circuit for limiting voltage overshoot on an input/output (I/O) pin of an associated integrated circuit (IC) device, comprising:

a discharge circuit connected between the I/O pin and ground potential;

a PMOS transistor connected between the I/O pin and an intermediate node and having a gate coupled to a voltage supply of the IC device; and a voltage level shifter circuit having a power terminal connected to the intermediate node, an output terminal coupled to the discharge circuit, and an input terminal to receive an enable signal.

18. The claim circuit of claim 17, wherein the discharge circuit comprises a single NMOS transistor connected between the I/O pin and ground potential and having a gate; and wherein the output terminal of the voltage level shifter circuit is coupled to the gate of the single transistor.

19. The clamp circuit of claim 18, further comprising:

a resistor connected between the gate of the NMOS transistor and ground potential.

20. The clamp circuit of claim 18, wherein the level shifter circuit turns on the NMOS transistor when voltage on the I/O pin is greater than a sum of a threshold voltage of the PMOS transistor and the voltage supply of the IC device if the enable signal is asserted.

21. The clamp circuit of claim 18, wherein the level shifter circuit maintains the NMOS transistor in a non-conductive state if the enable signal is de-asserted.

* * * * *